US011835391B2

(12) United States Patent
Assadi et al.

(10) Patent No.: US 11,835,391 B2
(45) Date of Patent: Dec. 5, 2023

(54) RADIATION DETECTOR INCLUDING FIELD EFFECT TRANSISTOR IN RESONANT CAVITY NANOSTRUCTURE

(71) Applicant: TIMBRE TECHNOLOGIES, INC., Washington, DC (US)

(72) Inventors: Saeed Assadi, Bryan, TX (US); James Pogge, Kingston, TN (US)

(73) Assignee: TIMBRE TECHNOLOGIES, INC., Washington, DC (US)

(*) Notice: Subject to any disclaimer, the term of this patent is extended or adjusted under 35 U.S.C. 154(b) by 0 days.

(21) Appl. No.: 17/506,378

(22) Filed: Oct. 20, 2021

(65) Prior Publication Data

US 2022/0042853 A1 Feb. 10, 2022

Related U.S. Application Data

(63) Continuation of application No. 16/486,400, filed as application No. PCT/US2018/018310 on Feb. 15, 2018, now Pat. No. 11,209,318.

(60) Provisional application No. 62/459,538, filed on Feb. 15, 2017.

(51) Int. Cl.
*G01J 5/20* (2006.01)
*G01T 1/24* (2006.01)
*G01T 3/08* (2006.01)
*H01L 31/112* (2006.01)

(52) U.S. Cl.
CPC ............ *G01J 5/20* (2013.01); *G01T 1/242* (2013.01); *G01T 3/08* (2013.01); *H01L 31/1121* (2013.01); *G01J 2005/202* (2013.01)

(58) Field of Classification Search
None
See application file for complete search history.

(56) References Cited

U.S. PATENT DOCUMENTS

| | | | |
|---|---|---|---|
| 5,070,241 A | 12/1991 | Jack | |
| 5,821,541 A | 10/1998 | Tumer | |
| 6,194,726 B1 | 2/2001 | Pi et al. | |
| 8,772,890 B2 * | 7/2014 | Kukushkin | G01T 1/00 257/428 |
| 11,209,318 B2 * | 12/2021 | Assadi | G01J 5/20 |
| 2004/0101861 A1 | 5/2004 | Little et al. | |

(Continued)

FOREIGN PATENT DOCUMENTS

WO 2009126582 A2 10/2009

OTHER PUBLICATIONS

Bashkirov et al., "Quantum-Interference Effects for Gamma Radiation under Crossing-Anticrossing Conditions for Nuclear Levels in an RF Field", JETP Letters, 2006, vol. 84, No. 4, pp. 176-179.

(Continued)

*Primary Examiner* — David P Porta
*Assistant Examiner* — Mamadou Faye
(74) *Attorney, Agent, or Firm* — Husch Blackwell LLP (57) ABSTRACT

A radiation detection device includes a plurality of field effect transistors (FETs) arranged to form a resonant cavity. The cavity includes a first end and a second end. The plurality of FETs provide an electromagnetic field defining an standing wave oscillating at a resonant frequency defined by a characteristic of the cavity. A radiation input passing through the cavity induces a perturbation of the electromagnetic field.

26 Claims, 8 Drawing Sheets

(56) References Cited

U.S. PATENT DOCUMENTS

| | | | |
|---|---|---|---|
| 2005/0017177 A1 | 1/2005 | Tai et al. | |
| 2005/0105077 A1* | 5/2005 | Padmanabhan | G01N 33/5094 356/39 |
| 2006/0081889 A1 | 4/2006 | Shur et al. | |
| 2008/0242029 A1* | 10/2008 | Wu | H01L 29/7809 257/E21.384 |
| 2010/0117891 A1* | 5/2010 | Utagawa | H03B 5/1852 342/175 |
| 2013/0072921 A1* | 3/2013 | Behnke, II | A61B 18/1815 606/33 |
| 2014/0320856 A1 | 10/2014 | McKeever et al. | |
| 2016/0147161 A1* | 5/2016 | Nikipelov | H01S 3/0903 355/67 |
| 2017/0017039 A1* | 1/2017 | Tu | G02B 6/12002 |

OTHER PUBLICATIONS

International Search Report and Written Opinion for Application No. PCT/US2018/018310 dated May 7, 2018 (16 pages).
European Patent Office Extended Search Report for Application No. 18753773.3 dated Sep. 18, 2020 (6 pages).

\* cited by examiner

RADIATION DETECTOR INCLUDING FIELD EFFECT TRANSISTOR IN RESONANT CAVITY NANOSTRUCTURE

CROSS-REFERENCE TO RELATED APPLICATIONS

This application is a continuation of U.S. patent application Ser. No. 16/486,400, filed Aug. 15, 2019, which is a national phase application of PCT Application No. PCT/US2018/018310, filed Feb. 15, 2018, which claims the benefit of U.S. Provisional Application No. 62/459,538, filed Feb. 15, 2017. The entire contents of these documents are incorporated by reference herein.

TECHNICAL FIELD

The present disclosure relates to a radiation detector and to a method of detection. More particularly, the disclosure relates to a radiation detector and to a method of detection capable of identifying source material, radiation energy, and source direction.

SUMMARY

Many radiation detectors operate based on a method requiring high purity solid crystals operating at extremely low temperatures and requiring high voltage bias fields. Other radiation detectors may use a secondary effect whereby incident radiation causes a response in a material, typically a scintillation of photon energy that is further detected using photon receivers, such as avalanche photo-floods and photo multiplier tubes. The result is an echo of the actual event, allowing digital signal processing techniques to approximate the probable cause of the incident radiation event.

Conventional radiation testing methods that specifically involve gamma and deep X-ray energy are limited in both the range of sensitivity of incident energy and the ability to specifically isolate the probable source material within the sensitivity band. Additionally, the large crystal structure of the sensors inhibits pixelization for imaging techniques. The large structure of the existing technology further prohibits detection and recovery necessary to capture low energy and fast pulse events.

Some detector systems require cryo-cooling or liquid nitrogen to operate efficiently, require a high voltage source as an electron bias voltage to aid the material's response, and/or require a large detector material to insure proper cascading of charged particles to generate a response. Additionally, the power requirements of some detecting systems are sufficiently high such that the detectors have limited operation due to the size of the system and batteries necessary to power the detectors, cryo-pumps, and electronics. Furthermore, the detection range (e.g., the isotope detection range) of available sensors is limited to low radiation environments and narrow operating temperatures, such that a variety of detector probes may be necessary to provide a large spectrum of isotope sensing capability.

In one aspect, a radiation detection device includes a plurality of field effect transistors (FETs) arranged to form a resonant cavity. The cavity includes a first end and a second end, and the plurality of FETs provide an electromagnetic field defining a standing wave oscillating at a resonant frequency defined by a characteristic of the cavity. A radiation input passing through the cavity induces a perturbation of the electromagnetic field.

In another aspect, a method of detecting radiation includes: tuning a detector cavity to be resonant with a frequency of radiation emitted by a target radiation source; receiving an incident radiation within the detector cavity; and detecting an incident frequency of the incident radiation.

In some aspects, the disclosure includes a detector and method capable of high resolution in an imaging array.

In some aspects, a gamma and/or neutron radiation detector does not require special environmental conditions, such as high voltage biasing and extremely low operating temperatures.

In some aspects, a gamma and/or neutron radiation detector requires low power, provides high sensitivity, and is actively tunable to filter out specific isotope sources.

In some aspects, a single device includes an array of electromagnetic radiation detectors capable of parallel detection.

In some aspects, the disclosure includes a device and a method for gamma and/or neutron radiation detection including a THz resonant cavity structure.

Other aspects will become apparent by consideration of the detailed description and accompanying drawings.

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Unless specified or limited otherwise, the terms "mounted," "connected," "supported," and "coupled" and variations thereof are used broadly and encompass both direct and indirect mountings, connections, supports, and couplings.

DETAILED DESCRIPTION

Gamma radiation is a type of electromagnetic radiation having a frequency greater than about $10^{19}$ Hz (less than about $10^{-11}$ m in wavelength). Conventional gamma radiation detection devices rely on either high purity crystals or gas ionization detectors, both of which suffer from low detection rates. In contrast, the disclosure relates to detection devices and methods having significantly greater sensitivity while reducing the need for additional electronics or processing to enhance signal detection. In some cases, the disclosed detection device and method can detect a single photon of gamma radiation.

Figure 1:
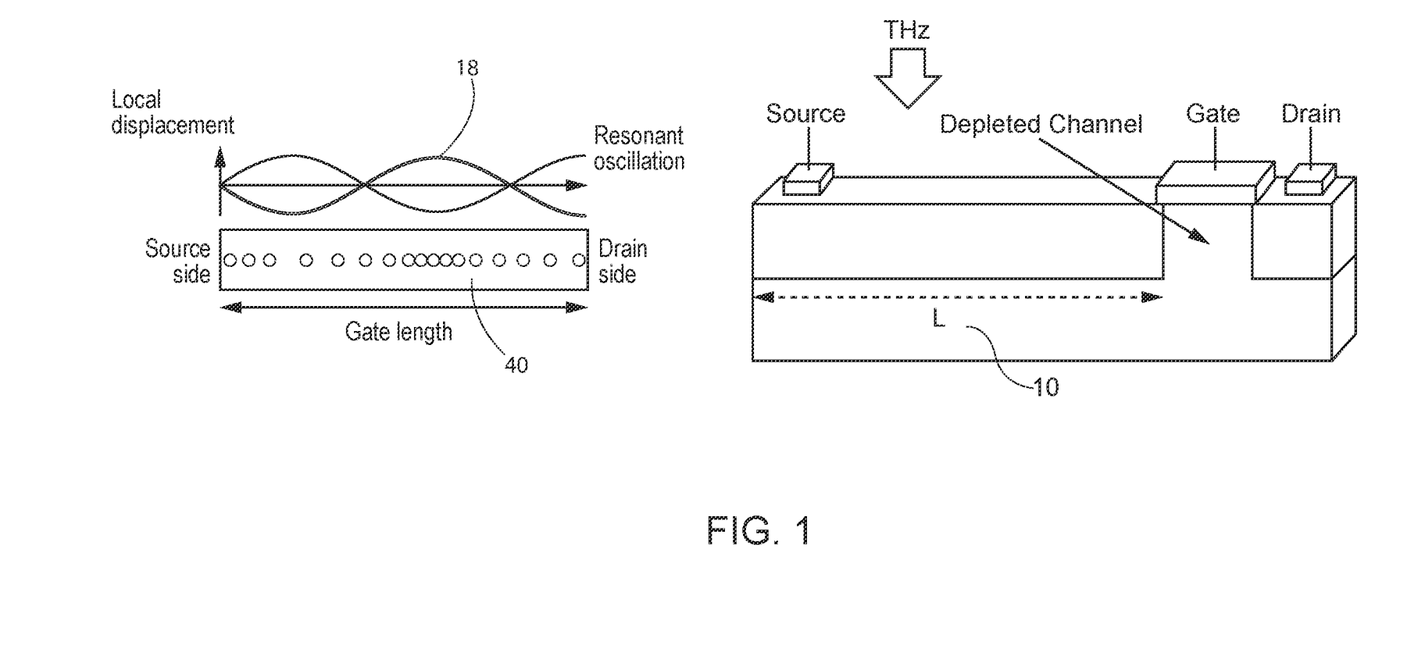
FIG. 1 illustrates a long gate field effect transistor (FET), the length of the gate being designed to be resonant at the terahertz frequency unique to the desired isotope's gamma response.
Figure 2:
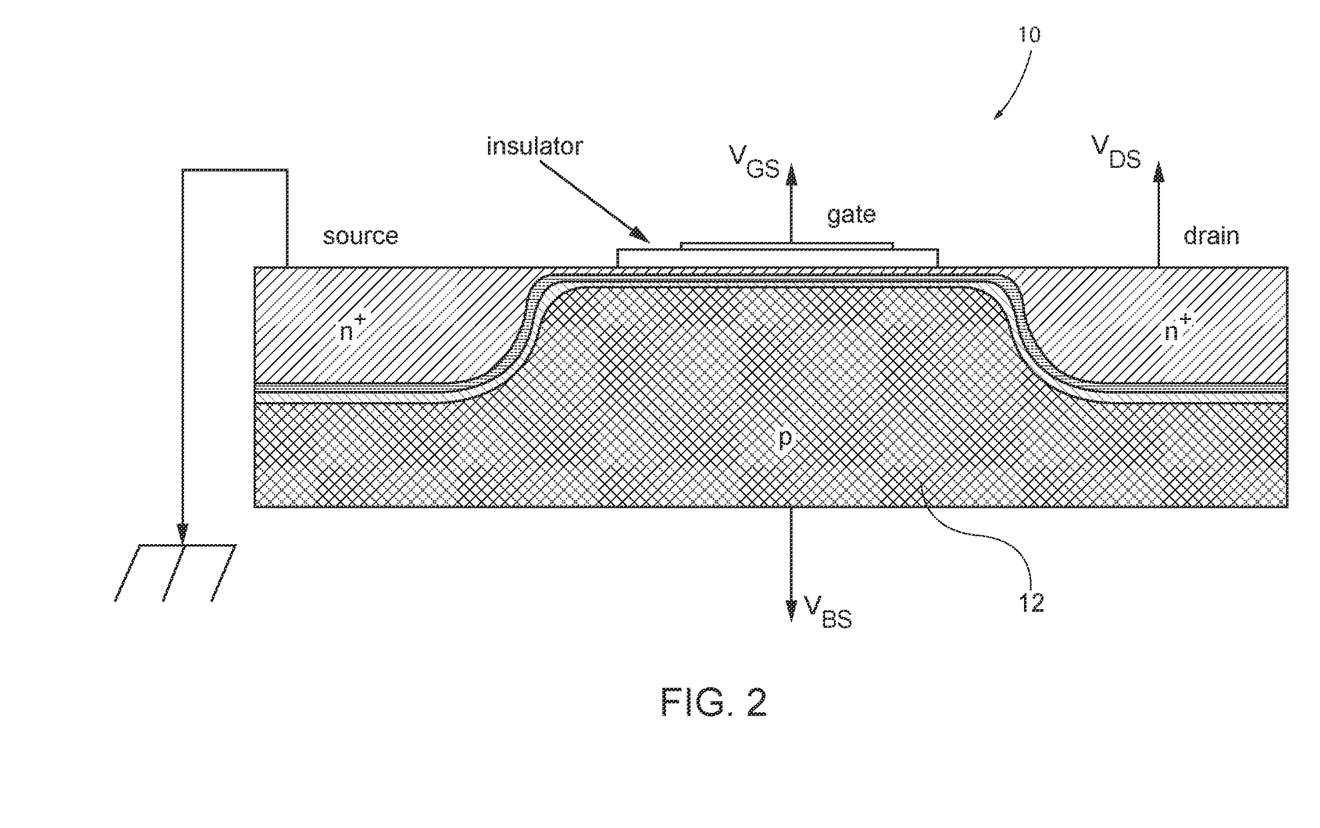
FIG. 2 illustrates a mesa long gate FET structure. The surface of the gate may be contiguous and uniformly flat to accommodate the resonant tuning structure of the long gate THz receiver.

FIGS. 1 and 2 illustrate a long gate field effect transistor (FET) 10 in which current flow in a semiconductor between a source and a drain is controlled by applying a bias voltage to create an electric field.

FIG. 2 illustrates a mesa-type long gate FET structure, in which the layers of an n- and p-type semiconductor are built in a fashion to produce a uniform slab rather than a stacked device. The uniformly flat shape permits the FET device 10 to easily act as a wall for a tuned cavity, as described in further detail below. The surface of the FET gate may be contiguous and uniformly flat to accommodate a resonant tuning structure of a long gate THz receiver, and to minimize any surface perturbations that may interfere with the resonant cavity feature. As shown in FIG. 2, a FET substrate 12 may contain a piezoelectric material.

Figure 3:
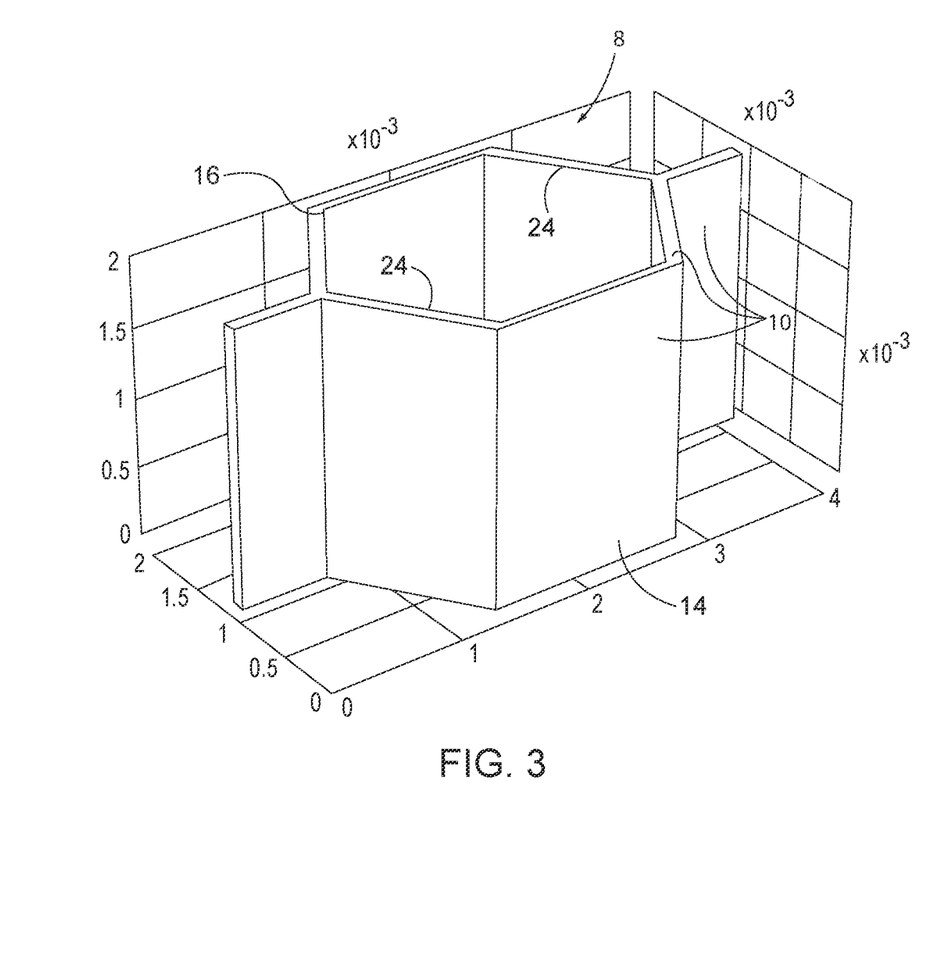
FIG. 3 illustrates a detector including multiple (e.g., six) long gate THz receivers arranged in a structure (e.g., a hexagon) to provide a tuned resonant cavity.

As shown in FIG. 3, a detector device 8 includes a plurality of FETs 10 arranged to form a tube or cavity 16. The FET 10, as a structure defining a portion of the cavity 16, is sensitive to a standing wave caused by an electric field within the resonant cavity 16, and the field in the semiconductor fluctuates when a cavity frequency is perturbed (e.g., by an input such as a gamma particle). In some embodiments, the length of the gate is resonant at the terahertz frequency unique to a desired isotope's gamma response. The cavity length can be equal to a tuned harmonic of a desired target gamma frequency for detection.

In some embodiments, the length of the gate of the FET is adjustable so that the resonant frequency may be adjusted to a different isotope's gamma response. In some embodiments, the length of the gate may be continuously varied to scan across a spectrum of frequencies. The substrate 12 (FIG. 2) can be formed from a piezoelectric material as part of the detection device's substrate, allowing the length of the FET(s) 10 and therefore the length of the cavity 16 to change and thereby permitting a user to tune the resonant cavity frequency. For example, the device can be manufactured at any length necessary to allow the device to act within the bandwidth of the target electromagnetic field to be detected. In an initial configuration, the length of the cavity 10 can be tuned to selectively detect gamma radiation emitted from a first source material (e.g., plutonium (Pu)), and the length of the cavity 16 can then be adjusted to selectively detect gamma radiation emitted from a second source material (e.g., copper (Cu)).

FIG. 3 illustrates an exemplary embodiment of a detector including a single cavity 16. In the illustrated embodiment, the detector includes six long gate FETs acting as THz receivers and arranged to form a cavity 16 having a closed perimeter (e.g., a hexagonal shape). In other embodiments, the resonant cavity 16 may have a different structure and/or shape (including, but not limited to, a triangle, a square, a pentagon, etc.). In some embodiments, a neutron-producing coating 14 reacts to a neutron striking the surface by producing a response gamma particle. The gamma particle may pass through the cavity 16 and be detected. FIG. 3 also illustrates the gated surface of the hexagonal cavity 16. In a two-dimensional array topology, the gate can be inside or outside a resonant cavity structure due to the mesa construction of the FET device. In the illustrated embodiment, the cavity 16 includes pairs of parallel walls 24, which facilitate measuring time of flight (TOF) for incident gamma radiation by measuring a difference in time from an incident gamma photon striking one wall before exiting the cavity 16 through the opposite wall.

The device may detect the radiation particle due to the particle's disturbing or perturbing electrons that group or collect at predetermined locations within the resonant cavity 16. When the resonant cavity is stable (i.e., natural resonance), the electromagnetic alternating current wave is essentially sinusoidal in nature. The wave can become a standing since wave (FIG. 1), such that the peaks of the sine wave do not move along the length of the cavity 16. The cavity 16 is tuned to a specific frequency such that the resulting standing wave is at or near motionless relative to the length cavity 16. The wavelength of the resonant frequency contains multiple peak maximum energy points 18 (FIG. 1), representing the peak of the electron resonant sine wave within the cavity. Electrons 40 in the EM field group or collect near the peak points, as measured in a longitudinal direction along a length of the cavity 16. In some embodiments, the electrons in the EM field within the wave collect substantially within a plane or disk extending through the resonant cavity 16 and perpendicular to a longitudinal axis of the cavity 16. Each plane or disk is located substantially at one of the peaks of the standing resonant sine wave. A space between these collections or groups of electrons can be perceived as a distance along a length of the cavity 16, and the distance between the groups of electron is equal to the resonant frequency wavelength of the cavity 16.

Incident photon or electromagnetic energy can cause a perturbation via multiple mechanisms. An incident electromagnetic field may directly cross through one or more of the electron field groups of the standing wave, causing a brief scattering. In addition (or alternatively), an incident electromagnetic wave may pass through a space between the electron groups, causing a space charge-related disturbance or perturbation of the stable electron group. Also, when incident gamma (or neutron) radiation crosses one of the long gate THz receivers, the radiation induces an oscillation in the standing wave of electrons, which can be detected with high sensitivity. The change in the standing wave causes a momentary loss or addition of the energy necessary to maintain the standing wave in balance in the cavity 16. This loss or gain of cavity energy causes electrons to flow into or out of the gate structure of the FET 10, and the resulting frequency disturbance of the FET device 10 (which is directly proportional to the energy of the incident electromagnetic field) is manifested as a mirror image current in the FET device 10. This current shift is detectable as both a current change and as a shift in the resonant frequency of the cavity 16, as the device naturally attempts to re-stabilize. An analogous reaction, for the purpose of illustration, is touching a plucked string: the frequency shifts and then attempts to regain a natural resonant point dictated by the length of the string.

When incident radiation crosses two or more THz receivers, it may be possible to determine one or more of the properties of speed, energy, and/or direction of the photon. Unlike existing methods based solely on energy transductance of a gamma photon (which requires the incident photon to be stopped through collisions with the detector material), the disclosed method of detection relies only on the interaction of the radiation with a high density of charged particles, located within the electron groups of the resonant cavity 16. The incident photon merely needs to perturb the resonant field to for its presence to be detected.

Figure 4:
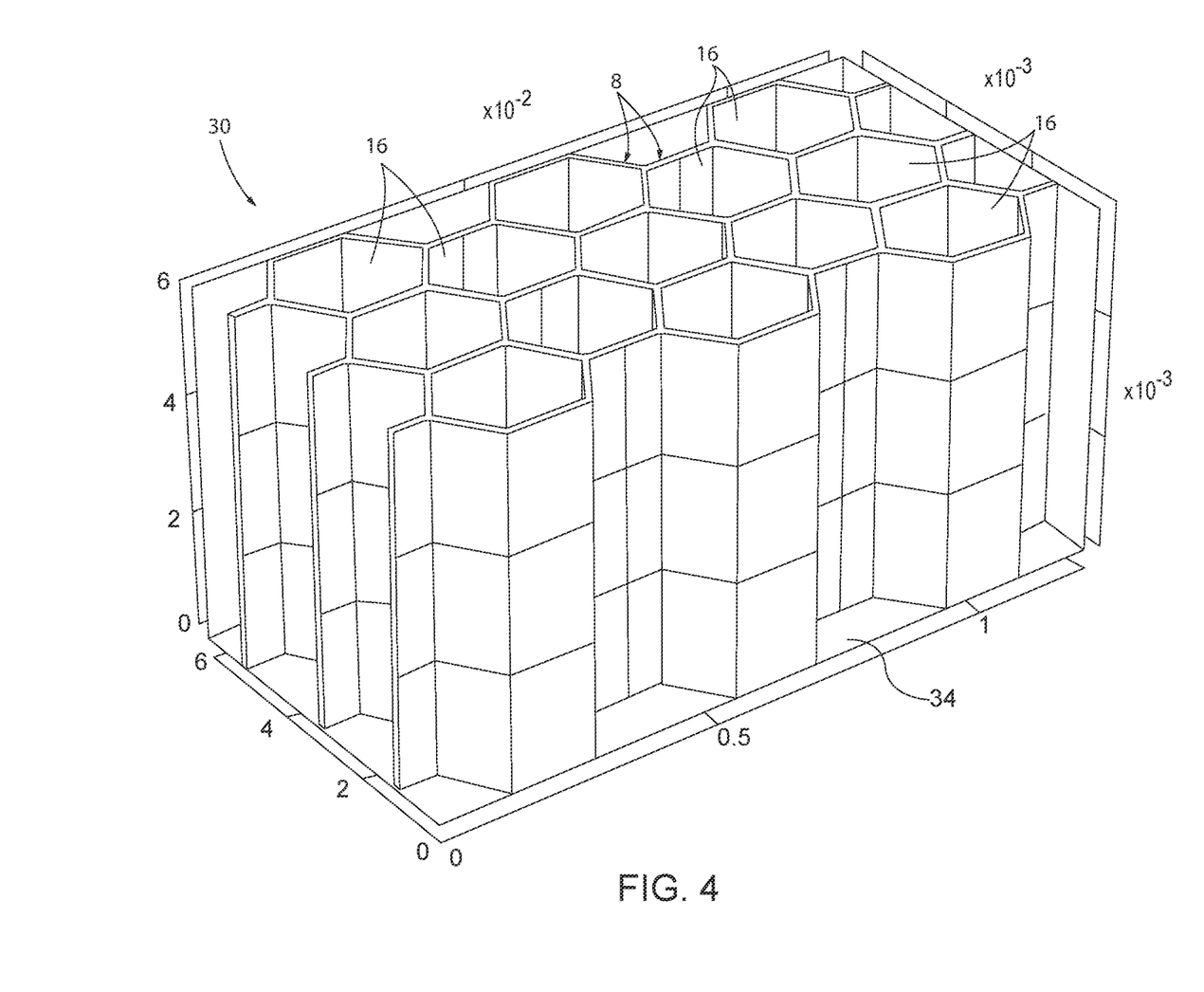
FIG. 4 illustrates a system of detectors arranged in an array of resonant nano-cavities, each including long gate THz receivers, as a two dimensional imaging array of gamma detectors.

As shown in FIG. 4, a system of multiple detectors 8 can be arranged in an array 30 of resonant nano cavities 16, with each cavity 16 including long gate THz receivers to form a two-dimensional imaging array of gamma detectors. A substrate 34 of the plane array 30 of detector cavities 16 on a semiconductor structure may contain scanning row and column switches for translating the individual cavity signals into an image stream for array detection. The system can be positioned within a detector housing (not shown).

In certain embodiments, an array of resonant nano cavities is configured to make an image, analogous to a charged coupled device (CCD). In certain embodiments, the array of resonant nano cavities may be one-dimensional, two-dimensional, or three-dimensional. The array of nano cavities may include a plurality of detectors (e.g., numbered 1 to n). A three-dimensional array can be formed by stacking two-dimensional arrays, each with varying cavity lengths such that a gamma photon incident along a perpendicular axis to the array can be detected in a wider resonant range. Incident gamma photons have very small interaction cross sections, so an array of small cavities increases the probability of identifying the position along the two-dimensional array where the gamma photon passes. Each resonant cavity within the array can represent an individual pixel of an imaging array, and the array is sensitive to direct conversion of gamma photons and indirect conversion of incident neutrons (through the detection of the gammas created when the neutron passes through one or more walls of a resonant cavity pixel).

A two-dimensional array of resonant cavity detectors therefore makes up a plane focal array used for imaging both gamma photons and incident neutrons (if a neutron interaction coating is included in the plane array construction). It is also possible to create a device or array that is sensitive to gamma radiation only by excluding the coating in the process. Neutron interaction coatings can cause gammas upon interaction of incident neutrons with the coating. Neutron interaction coatings may include, but are not limited to, boron, lithium, and/or combinations thereof.

Figure 5:
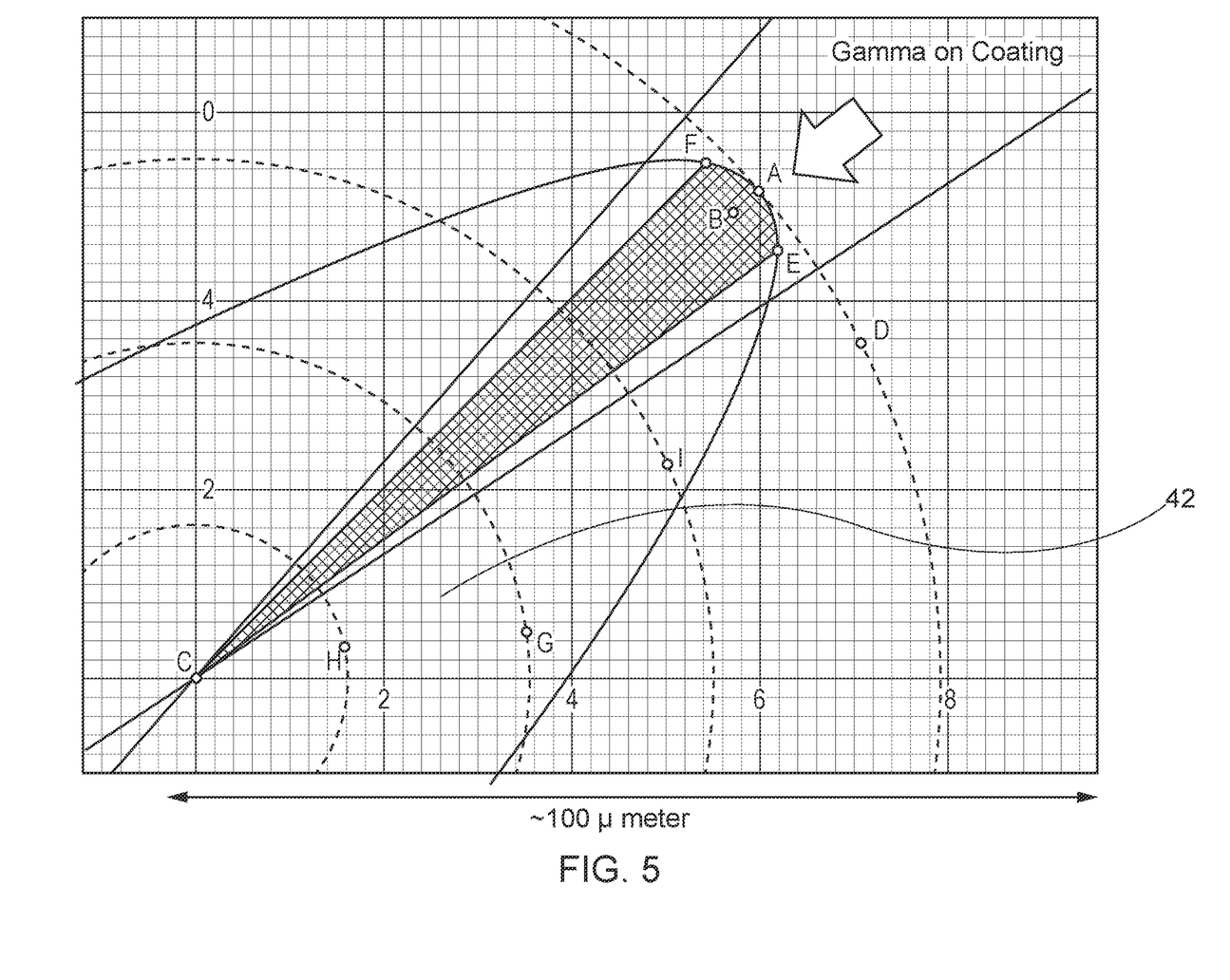
FIG. 5 schematically illustrates an optical coating deposited on a surface of a THz receiver structure for focusing incident gamma radiation along the surface of the detector.
Figure 6:
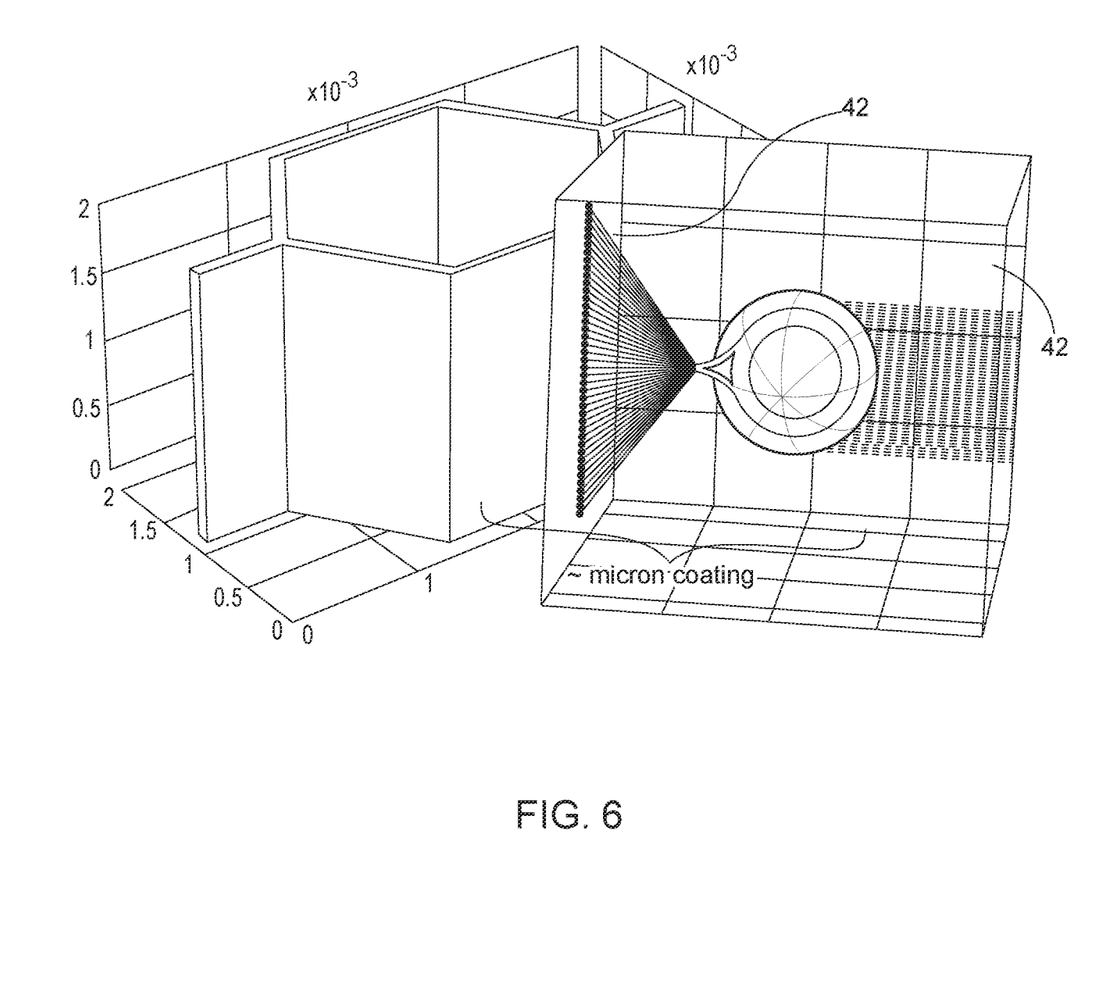
FIG. 6 illustrates a spherical optical concentration effect of a gamma focusing coating along a detector surface.

FIG. 5 illustrates an optical coating 42 positioned on a surface of a THz receiver structure for focusing incident gamma radiation along a surface of the detector. FIG. 6 illustrates a gamma-focusing coating that acts as a spherical optical concentrator for directing gammas along a detector surface.

Figure 7:
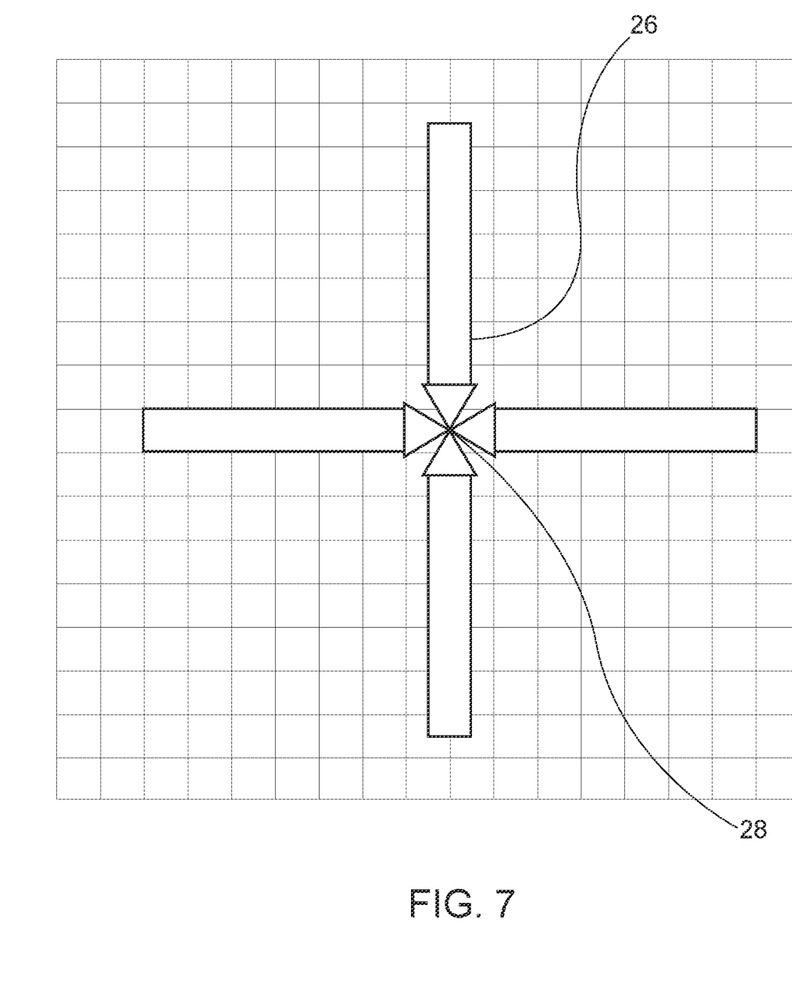
FIG. 7 illustrates an integrated nano-antenna for conducting resonant cavity energy from an incident gamma photon on a detector cavity and directing the energy to a down-converting Schottkey barrier detector-mixer diode structure built into a cavity device semiconductor.

FIG. 7 illustrates an integrated nano antenna 38 designed to conduct resonant cavity energy from an incident gamma photon on the detector cavity and direct the energy to a down-converting Schottkey barrier detector mixer diode structure built into the cavity device semiconductor. A body 26 of the nano antenna 38 detects a frequency shift of the resonant cavity energy and translates the shift to an electric current on the surface of the FET device 10 (FIG. 1). A coupling structure 28 may transfer the energy to the Schottkey barrier diode intrinsic to the FET 10 (e.g., the mesa FET) to down-convert the radio frequency (RF) to a more manageable lower frequency for further processing.

In some embodiments, the detector may be useful for optics applications in that the incident gamma photons create an electrical signal down-converted to a lower radio frequency (RF). This down conversion is not limited to a specific frequency or range. For example, the device convert incident gamma frequency down by multiple orders of magnitude (for example, from thousands of THz down to hundreds of THz) to produce visible light photons having an amplitude equal to the incident gamma or neutron energy passing through the resonant cavities 16. Accordingly, the device 8 can be used as a gamma-to-visible-light translator, making real time optical observations possible in a low-power, lightweight device.

Figure 8:
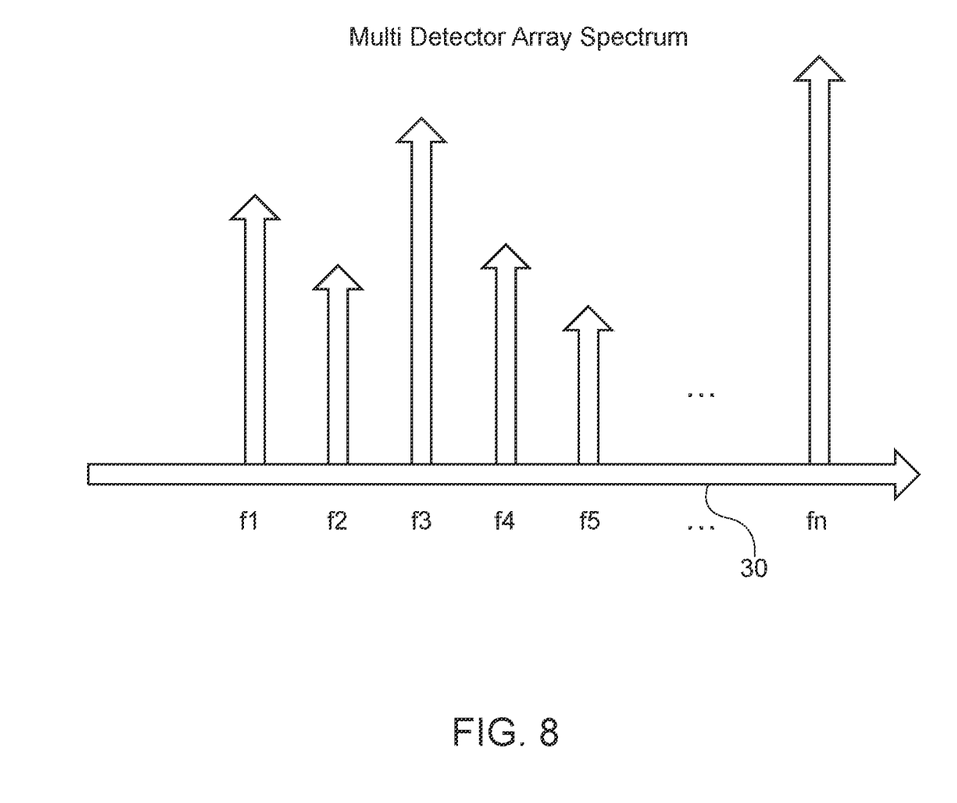
FIG. 8 illustrates a spectrum for an array of n detectors. The signal may be down mixed to a manageable lower frequency to then be transmitted in parallel over any connection medium of the device (e.g., optical, radio frequency, using fiber, cable, or wireless interface). The frequency is tunable and may be selected such that the signal can be sent from 1 to n detectors simultaneously without interference. The down converting signals may include, but are not limited to, separate wavelengths for parallel transmission or single wavelengths equal to each other as a gamma-to-visible converter.

FIG. 8 illustrates a signal spectrum for an array of a plurality of detectors (numbered 1 to n). A signal may be down-mixed to a manageable lower frequency to then be transmitted in parallel over any connection medium of the device (e.g., optical, radio frequency, using fiber, cable, or wireless interface). The down-converted frequency is tunable and may be selected such that the signal can be sent from 1 to n detectors simultaneously without interference. The down converting signals may include, but are not limited to, separate wavelengths for parallel transmission or single wavelengths equal to each other as a gamma-to-visible-light converter.

The FET detector, cavity structure, pre-processing electronics, and post-processing electronics may be made of any suitable semiconductor materials. In some embodiments, the semiconductor material is gallium nitride (GaN). One advantage of GaN is its capacity for functioning in high radiation fields.

It should be understood that while certain exemplary embodiments are configured to detect gamma radiation, the device may be configured to detect other forms of radiation. As described above, the device may be configured to detect neutron radiation. The device may also be configured to detect hard x-ray radiation by the addition of suitable gamma producing materials. The device is not limited to the high frequencies of the gamma spectrum. For example, larger areas coupled with longer cavities could be employed with the disclosed method to detect X-rays, optical signals and RF signals, such as for imaging radar frequencies. The desired target frequency of incident radiation (either particle or electromagnetic) is determined by the resonance of the cavity.

In some embodiments, disclosed is a device and/or method for gamma and/or neutron radiation detection using a THz resonant cavity structure. The cavity length of the detector is tunable through the application of a piezoelectric material embedded in the substrate, permitting a user to adjust or tune the cavity length by adjusting a voltage. In addition, the THz resonant cavity is sensitive to a wide range of incident photon energies. The detector is also capable of maintaining sensitivity and accuracy across a wide range of operating temperatures, including room temperature, and the detector can operate under low power, reducing resources and extending battery life. The mesa long gate FET structure facilitates forming the detector in a three-dimensional array, allowing imaging through distinct pixelization of an array detector output. The integrated antenna can pick up cavity resonance and direct incident energy to a Schottkey barrier detector down mixer. The integrated amplifier can increase down-converted gamma energy as a 5 to 8 GHz RF burst ready for final detection and processing. The array of n detectors may have separate center frequencies for each channel within the receiver bandwidth, such that a single wideband receiver or cable will permit parallel broadcast of multiple channels.

The embedded tunable quadrature antenna is capable of conducting energy from the resonant cavity detector to an RF detector diode. The embedded THz Schottkey barrier diode detector can act as both a detector and a down-converter to deliver signals to the final processing circuit.

Among other things, a gamma and/or neutron detector including a field effect transistor in a resonant cavity nanostructure, for the detection of incident gamma photons and neutrons of radioactive isotopes, may include:

1) a length-tuned long gate THz receiver, for tuning a resonant cavity to be more sensitive for a specific gamma radiation energy of a specific material isotope;
2) a uniformly flat structure mesa FET structure, for accommodating a hexagonal tube structure and allowing for a uniform deposition of gamma optical coating and neutron moderator materials (e.g., boron, diamond, lithium).
3) a resonant cavity hex structure, for a collection of three or more long gate THz receivers arranged into a resonant cavity tube to allow for directional sensitivity and array structures, comprising an enclosed cylinder making up the cavity structure.
4) a 2D imaging array, for THz receivers arranged into two-dimensional arrays to allow for imaging applications;
5) a concentrator optical coating, for distributing gamma energy along the surface of the detector for maximum THz transfer;
6) a tunable piezoelectric substrate, for user controlled tuning of the cavity length to filter and isolate specific isotopes and photon ranges;
7) a boron neutron moderator, for transferring incident neutron energy into gamma energy on the surface of the detector to accommodate using the structure as a neutron sensitive detector;
8) time of flight parallel planes, for measuring incident energy direction and approximate time of flight by using calibrated parallel detection surfaces within the cavity structure. Time of flight is measured when an incident photon strikes one wall of two plane parallel walls first and then passes through the second wall later. The difference in the time of the incident energy peaks caused by the passing through one then the other is used to calculate the incident photons TOF.
9) an incident resonant energy embedded nano antenna, for coupling of cavity resonant energy due to incident gamma photons;
10) a down converting Schottkey THz detector, for detection and down converting of incident gamma photon energy to a manageable RF frequency; and
11) each individual signal being measured independently in succession, and each signal optionally having different incident energies. The process signal, when down converted from the detecting cavity, will be separated by the resulting frequency shift delta (f) for parallel processing and detection of a range within the spectrum of incident gamma photons.

Although aspects have been described in detail with reference to certain preferred embodiments, variations and modifications exist within the scope and spirit of one or more independent aspects as described. Various features and advantages are set forth in the following claims.

What is claimed is:

1. A radiation detection device comprising:
a plurality of field effect transistors (FETs) arranged to form a resonant cavity, the cavity including a first end and a second end, the plurality of FETs providing an electromagnetic field defining a standing wave oscillating at a resonant frequency defined by a characteristic of the cavity, a radiation input passing through the cavity inducing a perturbation of the electromagnetic field.

2. The radiation detection device of claim 1, wherein each of the FETs is a uniformly flat mesa long gate FET.

3. The radiation detection device of claim 1, wherein the resonant cavity is a first resonant cavity, and further comprising a second plurality of FETs arranged to form a second resonant cavity, the first resonant cavity and the second resonant cavity arranged in a periodic array, the first resonant cavity and the second resonant cavity sharing a common wall formed by one of the FETs.

4. The radiation detection device of claim 3, wherein the first resonant cavity is configured to detect radiation originating from a first source type, and the second resonant cavity is configured to detect radiation originating from a second source type.

5. The radiation detection device of claim 1, wherein the resonant cavity is continually adjusted to vary the resonant frequency in order to scan for radiation originating from a variety of source types.

6. The radiation detection device of claim 1, wherein the characteristic is a length of the cavity extending between the first end and the second end, wherein the length of the cavity is adjustable.

7. The radiation detection device of claim 1, wherein at least a portion of each of the FETs is formed from a piezoelectric material, permitting a length of the cavity to be adjusted.

8. The radiation device of any one of claim 6, wherein adjusting a length of the cavity adjusts the resonant frequency.

9. The radiation detection device of claim 8, wherein the resonant frequency is adjustable to target radiation emitted by a predetermined source material.

10. The radiation detection device of claim 1, wherein the resonant cavity extends along a longitudinal axis between the first end and the second end, the resonant cavity having a hexagonal cross-section.

11. The radiation detection device of claim 1, wherein the plurality of FETs includes at least two FETs oriented parallel to one another, the radiation detection device measuring time-of-flight of the radiation input.

12. The radiation detection device of claim 1, further comprising a gamma focusing coating.

13. The radiation detection device of claim 1, further comprising an integrated nano antenna configured to direct energy to a down-converting Schottkey barrier detector mixer diode structure.

14. The radiation detection device of claim 1, wherein electrons within the resonant cavity concentrate near each peak of the standing wave, the perturbation caused by the radiation input inducing a fluctuation in the electromagnetic field.

15. The radiation detection device of claim 1, wherein the radiation detection device is operable at room temperature.

16. The radiation detection device of claim 1, wherein each of the FETs includes a GaN semiconductor.

17. A radiation detection device comprising:
a plurality of field effect transistors (FETs), the FETs positioned to at least partially enclose a resonant cavity, the resonant cavity including a first end and a second end, the plurality of FETs providing an electromagnetic field within the resonant cavity, the electromagnetic field defining a standing wave oscillating at a resonant frequency defined by a characteristic of the cavity, the passage of a radiation input through the resonant cavity causing a perturbation of the electromagnetic field, the perturbation causing a detectable change in current in the FETs indicative of the radiation input.

18. The radiation detection device of claim 17, wherein each of the FETs is a mesa long gate FET having a planar surface.

19. The radiation detection device of claim 17, wherein the resonant cavity is a first resonant cavity, and further comprising a second plurality of FETs arranged to form a second resonant cavity, the first resonant cavity and the second resonant cavity sharing a common wall formed by one of the FETs.

20. The radiation detection device of claim 19, wherein the first resonant cavity is configured to detect radiation originating from a first source type, and the second resonant cavity is configured to detect radiation originating from a second source type.

21. The radiation detection device of claim 17, wherein at least a portion of each of the FETs is formed from a piezoelectric material, permitting a length of the cavity to be adjusted.

22. The radiation detection device of claim 17, wherein the characteristic is a length of the resonant cavity extending between the first end and the second end, wherein the length of the cavity is adjustable to adjust the resonant frequency.

23. The radiation detection device of claim 17, wherein the resonant cavity extends along a longitudinal axis between the first end and the second end, the resonant cavity having a polygonal cross-section.

24. The radiation detection device of claim 17, wherein the plurality of FETs includes at least two FETs oriented parallel to one another and spaced apart from one another by a predetermined distance, the radiation detection device configured to measure a time-of-flight of the radiation input.

25. The radiation detection device of claim 17, wherein electrons within the resonant cavity concentrate near each peak of the standing wave, the perturbation caused by the radiation input inducing a fluctuation in the electromagnetic field.

26. The radiation detection device of claim 17, wherein each of the FETs includes a GaN semiconductor.

* * * * *